US011368014B2

(12) United States Patent
Jensen

(10) Patent No.: US 11,368,014 B2
(45) Date of Patent: Jun. 21, 2022

(54) GROUND FAULT PROTECTION CIRCUIT AND TECHNIQUES

(71) Applicant: Littelfuse, Inc., Chicago, IL (US)

(72) Inventor: Kristophor Ray Jensen, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/876,705

(22) Filed: May 18, 2020

(65) Prior Publication Data

US 2021/0359507 A1 Nov. 18, 2021

(51) Int. Cl.
| H02H 5/10 | (2006.01) |
| H02H 3/16 | (2006.01) |
| H02H 3/05 | (2006.01) |
| H02H 3/02 | (2006.01) |
| G01R 31/52 | (2020.01) |

(52) U.S. Cl.
CPC ............ *H02H 5/105* (2013.01); *G01R 31/52* (2020.01); *H02H 3/025* (2013.01); *H02H 3/165* (2013.01); *H02H 3/167* (2013.01)

(58) Field of Classification Search
CPC ........ H02H 5/105; H02H 3/167; H02H 3/025; H02H 3/165; G01R 31/52
See application file for complete search history.

(56) References Cited

U.S. PATENT DOCUMENTS

| 4,589,048 A * | 5/1986 | Takata ................... G01R 27/18 |
| | | 361/42 |
| 8,405,940 B2 * | 3/2013 | Schweitzer, III ........ H02H 3/17 |
| | | 361/42 |
| 9,431,820 B2 * | 8/2016 | Neddermeyer, III .... H02H 9/08 |
| 9,500,710 B2 * | 11/2016 | Thompson ........... G01R 31/343 |
| 10,511,164 B2 * | 12/2019 | Seo ......... H02H 9/005 |
| 10,530,144 B2 * | 1/2020 | Ali .......... H02H 3/52 |
| 11,108,222 B2 * | 8/2021 | Jensen ...................... H02H 9/08 |
| 2003/0197989 A1 * | 10/2003 | Nojima ..................... B60L 3/00 |
| | | 361/47 |
| 2009/0160454 A1 * | 6/2009 | Johansson ................ H02H 3/17 |
| | | 324/509 |
| 2009/0254297 A1 * | 10/2009 | Bengtsson ............. G01R 27/16 |
| | | 702/117 |
| 2010/0217546 A1 * | 8/2010 | Locker ................... G01R 19/06 |
| | | 702/58 |

(Continued)

*Primary Examiner* — Sisay G Tiku
(74) *Attorney, Agent, or Firm* — KDB PLLC

(57) ABSTRACT

A fault protection arrangement. The fault protection arrangement may include a neutral grounding resistor including a first non-ground end, connected to a neutralizing point, and a second non-ground end. The fault protection arrangement may include a neutral grounding resistance monitor assembly, directly coupled to the second non-ground end of the neutral grounding resistor. The neutral grounding resistance monitor assembly may include comprising a signal source coupled to the neutralizing-point; a first current sense circuit coupled between the signal source and the neutralizing-point; a first voltage sense circuit coupled between the signal source and the neutralizing-point; a second current sense circuit, comprising a current sensor, coupled between the second non-ground end of the neutral grounding resistor and a protective earth connection.

19 Claims, 5 Drawing Sheets

(56) References Cited

U.S. PATENT DOCUMENTS

| | | | | |
|---|---|---|---|---|
| 2014/0177117 A1* | 6/2014 | Curtis | ................... | H02H 3/162 |
| | | | | 361/93.1 |
| 2015/0048840 A1* | 2/2015 | Vangool | ................ | H02H 5/105 |
| | | | | 324/509 |
| 2015/0061690 A1* | 3/2015 | Curtis | ..................... | H02H 3/17 |
| | | | | 324/509 |
| 2015/0212139 A1* | 7/2015 | Smith | ................... | G01R 31/52 |
| | | | | 324/509 |
| 2015/0326004 A1* | 11/2015 | Curtis | ..................... | H02H 1/06 |
| | | | | 361/47 |
| 2015/0346262 A1* | 12/2015 | Curtis | ................... | H02H 5/105 |
| | | | | 324/509 |
| 2015/0346264 A1* | 12/2015 | Curtis | ................... | G01R 31/50 |
| | | | | 324/509 |
| 2018/0315573 A1* | 11/2018 | Curtis | ................. | G01R 19/155 |
| 2021/0063495 A1* | 3/2021 | Curtis | ..................... | G01R 31/54 |

\* cited by examiner

GROUND FAULT PROTECTION CIRCUIT AND TECHNIQUES

FIELD

Embodiments relate to the field of protection devices, an in particular, to neutral grounding resistors.

BACKGROUND

Ground fault resistors, or neutral grounding resistors, may be used in conjunction with resistance grounded power systems. A neutral grounding resistor may be deployed under conditions where a ground fault is to be limited to a predetermined current. Neutral grounding resistors may also be accompanied by a monitor to monitor when degradation of neutral grounding resistor may take place. In some jurisdictions, monitoring of neutral grounding resistors is required during all operation phases for changes in resistance value. To couple a monitoring system to a power system, such as a three phase transformer coupled system, a sense signal or injection signal may be provided to periodically monitor the status of a neutral grounding resistor. Notably, in such circuitry, where a monitor that injects the sense signal is coupled through a capacitive/inductive circuit to the neutral grounding resistor, a phase shift in the injection signal may take place.

In view of the above, the present embodiments are provided.

BRIEF SUMMARY

In one embodiment, a fault protection arrangement is provided. The fault protection arrangement may include a neutral grounding resistor that includes a first non-ground end, connected to a neutralizing point, and a second non-ground end. The fault protection arrangement may further include a neutral grounding resistance monitor assembly, directly coupled to the second non-ground end of the neutral grounding resistor. The neutral grounding resistance monitor assembly may include a signal source coupled to the neutralizing-point, a first current sense circuit coupled between the signal source and the neutralizing-point, a first voltage sense circuit coupled between the signal source and the neutralizing-point; and a second current sense circuit, comprising a current sensor, coupled between the second non-ground end of the neutral grounding resistor and a protective earth connection.

In another embodiment, a further fault protection arrangement is provided. The fault protection arrangement may include a neutral grounding resistor comprising a first non-ground end, connected to a neutralizing point, and a second non-ground end. The fault protection arrangement may further include a neutral grounding resistance monitor assembly, directly coupled to the second non-ground end of the neutral grounding resistor. The neutral grounding resistance monitor assembly may include a signal source coupled to the neutralizing-point, a first sense circuit coupled between the signal source and the neutralizing-point; and a first voltage sense circuit coupled between the signal source and the neutralizing-point. The neutral grounding resistance monitor assembly may further include a second current sense circuit, comprising a current sensor coupled between the second non-ground end of the neutral grounding resistor and the protective earth connection, as well as a second voltage sense circuit, coupled to the first non-ground end of the neutral grounding resistor.

In a further embodiment, a fault protection method may include connecting a power system to a fault protection arrangement. The fault protection arrangement may include a neutral grounding resistor comprising a first non-ground end, connected to a neutralizing point, and a second non-ground end. The fault protection arrangement may further include a neutral grounding resistance monitor assembly, coupled to the first non-ground end and comprising a plurality of sense circuits. The method may further include sending a signal from a signal source of the neutral grounding resistance monitor assembly to a neutralizing point of the power system. The method may also include sensing a first current ($I_1$) between the signal source and the neutralizing point; sensing a first voltage ($V_1$) between the signal source and the neutralizing point; and sensing a second current ($I_2$) between the second non-ground end and a protective earth terminal. The method may also include determining a ratio of $V_1/I_1$ and a ratio of $V_2/I_2$; and sending a trip signal to disconnect the power system, when just the ratio of $V_1/I_1$, just the ratio of $V_2/I_2$ or both the ratio of $V_1/I_1$ and the ratio of $V_2/I_2$ fall outside of a predetermined range.

DESCRIPTION OF EMBODIMENTS

Figure 1:
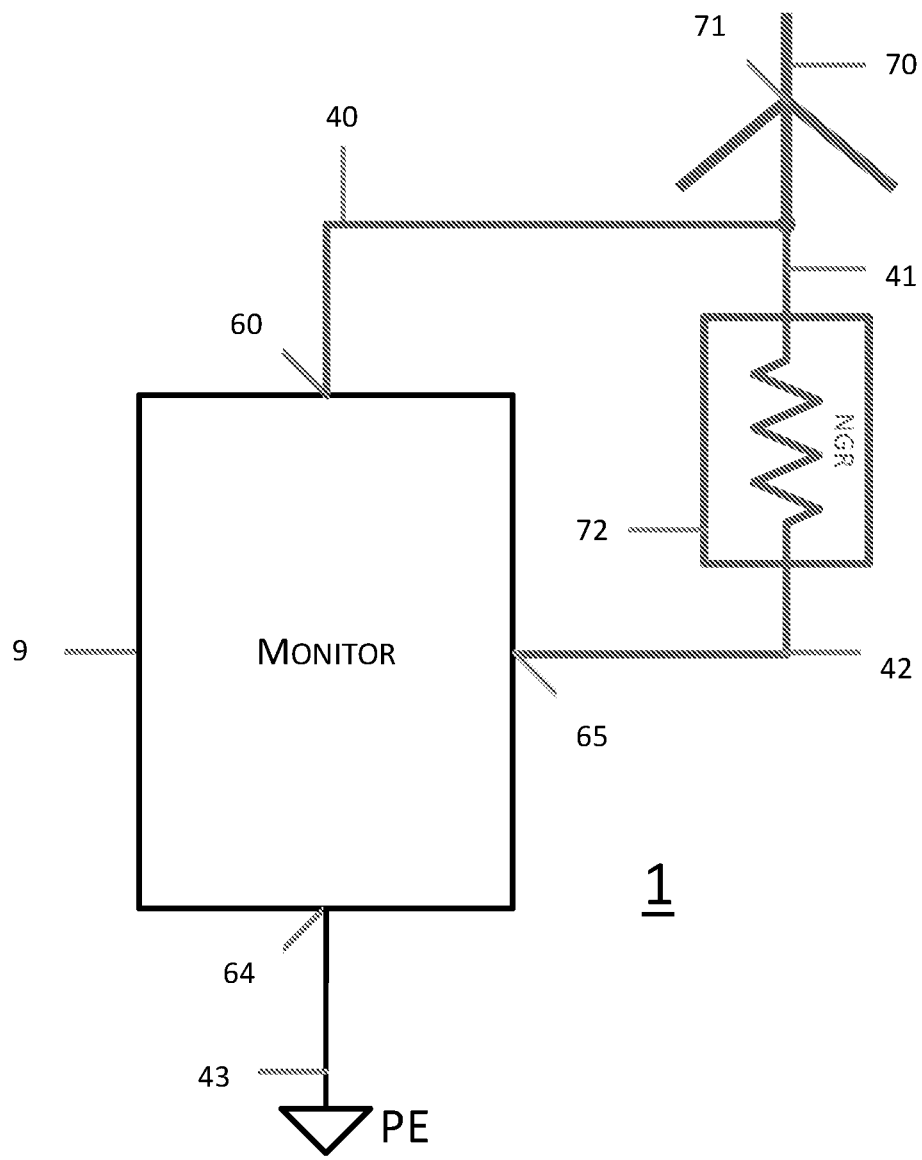
FIG. 1: Shows a protection arrangement according to various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

A listing of various components for the instant figures is detailed in Table I.

TABLE 1

| Item | Description |
| --- | --- |
| 1 | A fault protection arrangement |
| 2 | Details of a fault protection arrangement |
| 3 | A fault protection arrangement utilizing a 3-wire measurement technique |
| 4 | Exemplary process flow diagram |
| 9 | Neutral grounding resistor monitor |
| 10 | Signal source waveform generator |
| 11 | Signal source amplifier (current or voltage output) |
| 12 | Output current measurement resistor element |
| 13 | Output current measurement amplifier and signal conditioning |
| 14 | Overvoltage protection |
| 15 | Voltage measurement circuitry |
| 16 | Voltage measurement amplifier and signal conditioning |
| 17 | Low-side current sense circuity |
| 18 | Low-side current sense amplifier and signal conditioning |
| 19 | Unidirectional two-terminal high-voltage current limiting apparatus |
| 20 | Unidirectional two-terminal high-voltage current limiting apparatus |
| 21 | Signal processing and control device |
| 22 | Trip control relay |
| 23 | Protective earth connection detection apparatus |
| 24 | Overvoltage protection |
| 40 | Coupling wire between monitor output and transformer neutralizing point |
| 41 | Coupling wire between transformer neutralizing point and high-side terminal of neutral grounding resistor |
| 42 | Coupling wire between low-side terminal of neutral grounding resistor and the neutral grounding resistor monitor |
| 43 | Coupling wire between neutral grounding resistor monitor and protective earth |
| 44 | Coupling wire for voltage sense circuit to cancel parasitic effects of wires 40 and 41 |
| 60 | Coupling terminal between the neutral grounding resistor monitor and the transformer neutralizing point, located on the neutral grounding resistor monitor |
| 61 | Coupling terminal between the neutral grounding resistor high-side connection and the transformer neutralizing point, located on the neutral grounding resistor |
| 62 | Coupling terminal between the neutral grounding resistor low-side connection and the neutral grounding resistor monitor low-side terminal, located on the neutral grounding resistor |
| 63 | Coupling terminal between the neutral grounding resistor low-side connection and th eneutral grounding resistor monitor low-side terminal, located on the neutral grounding resistor monitor |
| 64 | Coupling terminal between the neutral grounding resistor monitor ground terminal and the power system protective earth connection intended for power system reference |
| 65 | Coupling terminal between the neutral grounding resistor monitor ground terminal and the power system protective earth connection intended for protective earth integrity monitoring |
| 70 | Protected 3-phase power system transformer secondary |
| 71 | Transformer neutralizing point connection |
| 72 | Neutral grounding resistor |
| 73 | Electronically actuated disconnect |

Figure 2A:
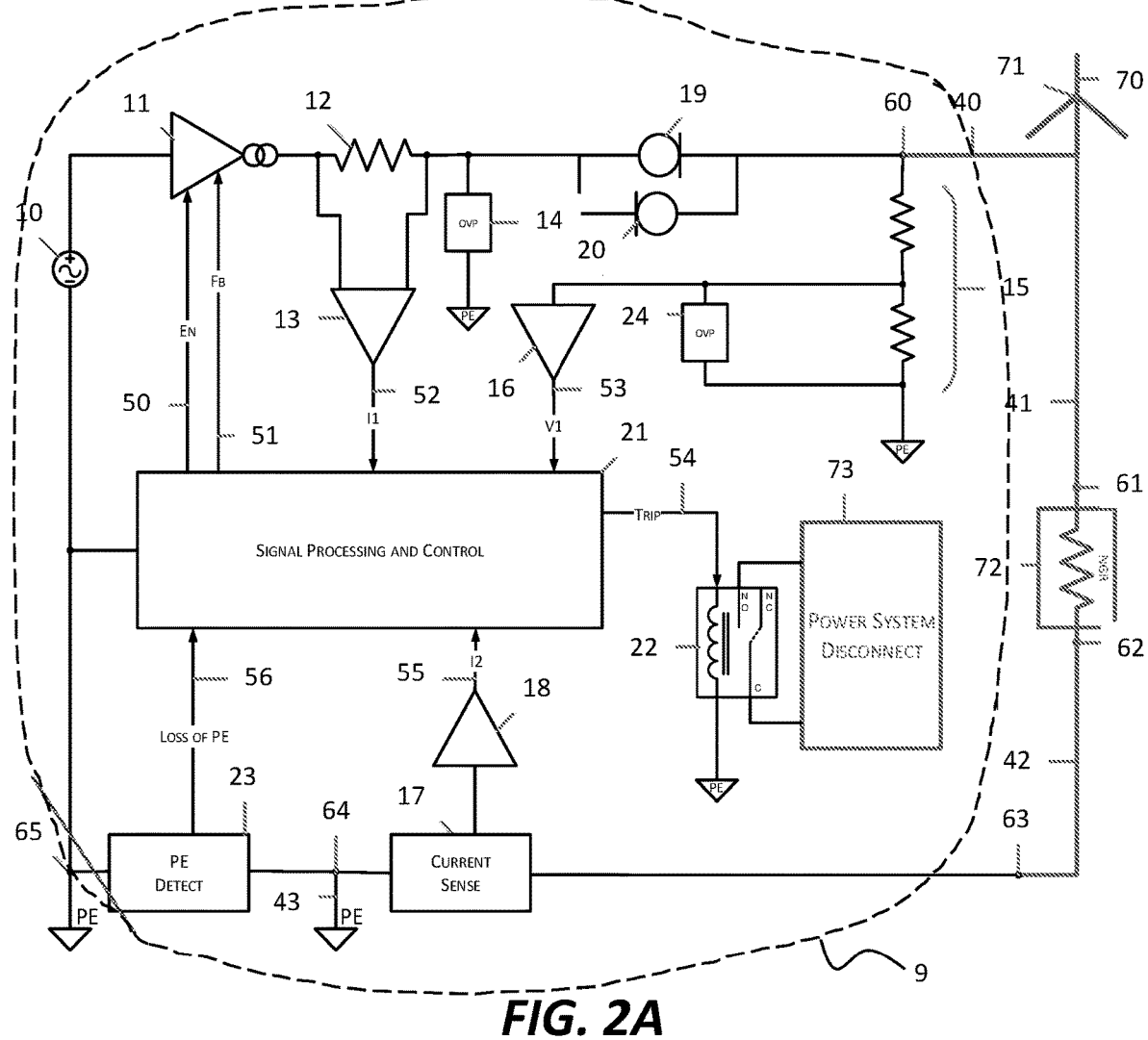
FIG. 2A: Presents details of a fault protection arrangement according to various embodiments of this disclosure.

In various embodiments, systems and devices are included for providing fault protection. FIG. 1 shows fault protection arrangement 1 according to various embodiments of the disclosure. FIG. 2A presents detail of one variant of protection arrangement 1, according to various embodiments of this disclosure; The fault protection arrangement 1 includes transformer secondary 70, transformer neutralizing point 71, coupled to the a first non-ground end, shown as high-side connection point 61 of neutral grounding resistor 72 through wire 41.

A second non-ground end, shown as the low-side connection point 62 of the neutral grounding resistor 72, is coupled to the neutral grounding resistor monitor, shown as neutral grounding resistor monitor assembly 9 between second connection point 62 and connection point 63 via coupling wire 42. A monitor assembly shown as neutral grounding resistor monitor assembly 9 provides a low-ohmic path to protective earth connecting to a terminal (64) via coupling wire 43. The neutral grounding resistor monitor assembly 9 injects a signal to transformer neutralizing point 71 from connection terminal 60 via coupling wire 40. Voltages induced within neutral grounding resistor monitor assembly 9 and currents that are measured leaving terminal 60 and returning through terminal 63 as a result of injected signals are used to calculate the DC resistance of the neutral grounding resistor 72. An advantage afforded by the configuration of FIG. 1 and in the embodiments to follow is that, the injection signal provided by the neutral grounding resistor monitor assembly does not travel through a capacitive/inductive circuit as injected through the neutral grounding resistor, and therefore may be injected with zero phase shift, rendering leakage measurement more facile.

Neutral grounding resistor monitor assembly 9 is shown in greater detail within FIG. 2A. The detail within FIG. 2 will be described by the following hierarchy: primary signal path items 10, 11, 12, 19, 20, 60, 40, 71, 41, 61, 72, 62, 42, 63, 17, 64, 43; measurement signals and signal conditioning items 13, 14, 15, 16, 18, 24, 52, 53, 55; control items 21, 22, 23, 50, 51, 54, 56, 73. A signal source, shown as signal generator 10, may be configured to provide excitation to amplifier 11 in the form of various waveform profiles, including DC levels, AC signals and arbitrary waveforms. The operation mode of amplifier 11 may be configured for voltage amplification, current amplification, transconductance amplification or transimpedance amplification. The output of amplifier 11 is monitored through current sense resistor 12 and voltage monitor 15. Generally, the signal source generator 10 may be configured to generate a current-controlled output chosen from one of: DC, AC, and arbitrary waveform, or may be configured to generate a voltage-controlled output chosen from one of: DC, AC, and arbitrary waveform. Generally elements of at least a second current sense circuit as described herein may be arranged as a non-contact sense circuit.

Current-limiting element 19 and current limiting element 20 are provided in series with the current sense resistor 12 and voltage monitor 15, and are arranged to provide an AC current path, which maximum is limited to a value survivable by the electronic measurement path. In various additional embodiments of neutral grounding resistor monitor assembly 9, this path can be configured as a DC path by just providing current limiting element 19 or current limiting element 20. In various non-limiting embodiments, the current-limiting element 19 and current limiting element 20 are configured as a two-terminal high-voltage current-limiting electronic device coupled between the signal source and the transformer neutralizing-point.

Furthermore, in different variants, the current limiting element 19 and current limiting element 20 can have their voltage breakdown characteristic augmented by increasing the number of series elements. Voltage breakdown becomes important when during the normal course of operation, a ground-fault occurs in a manner forcing the voltage at transformer neutralizing point 71 to system line voltage. Full system voltage will then be impressed on terminal 60 via coupling wire 40. The combination of current limiting element 19, current limiting element 20 and an overvoltage protection element 14 together form a protective circuit, ensuring that the provided electronics are not electrically overstressed. The combination of current limiting element 19 and current limiting element 20 further allows for measurements of the neutral grounding resistor 72 to be made during partially energized conditions.

In operation, the integrity of the conduction path including connection items 60, 61, 62, 63 and 64 plus wire items 40, 41, 42, and 43 is to be continuously monitored. A probe or injection signal from the signal generator 10 may be sent out at least once per second, for example. In a first and a third embodiment (see FIGS. 1 and 3), the continuity monitoring path is used as the primary measurement path. As shown in FIG. 1, a current sense element 17 is provided between second connection point 62, on the low side of neutral grounding resistor 72, and a protective earth connection item 64. During ideal conditions, the current provided by amplifier 11 and measured through resistor 12 will be the same as current travelling through the primary signal path and through a current sense element 17. The primary signal path described above is to be measured by various components, beginning with current sense resistor 12 and amplifier 13, in order to create a signal $I_1$ (52). Signal $I_1$ (52) provides a representation of the output current to transformer neutralizing point 71. When transformer 70 has zero parasitic loss between the power conductors and protective earth, signal $I_1$ (52) will match signal 12 (55), measured by current sensor 17 and conditioned by amplifier 18.

The current sense element 17 is designed have a low-ohmic characteristic so as to not materially affect the value of neutral grounding resistor 72. The current passing through the primary path will create a voltage in accordance with Ohm's law. This voltage may be measured by a first voltage sense circuit, shown as monitoring network or voltage monitor 15, at terminal 60. This voltage will be conditioned by an amplifier 16 into a signal $V_1$ (53). Referring also again to FIG. 2A, amplifier 16 is protected by an overvoltage protection network 24.

Figure 2B:
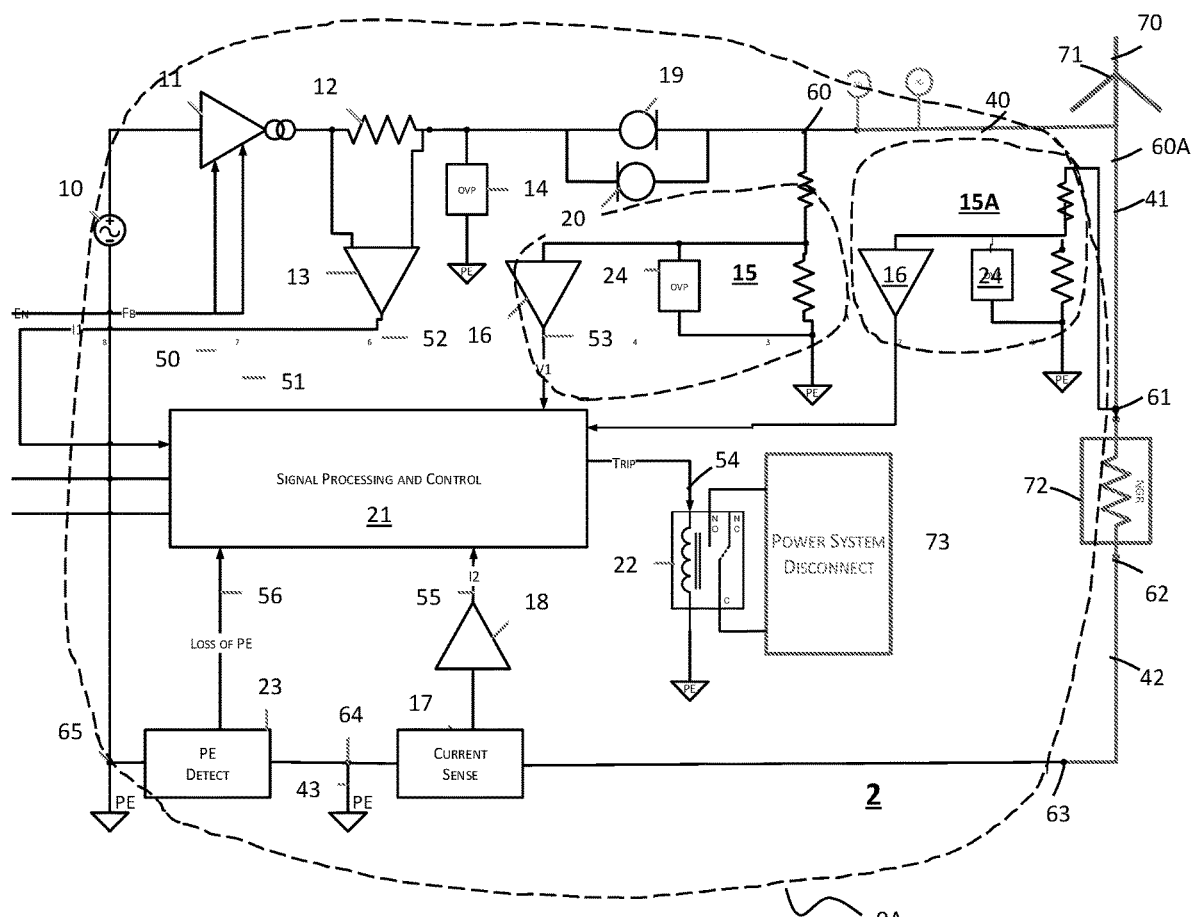
FIG. 2B presents details of another fault protection arrangement according to various embodiments of this disclosure.

Further embodiments may include a second voltage measurement circuit at the high-side connection 61 of neutral grounding resistor 72. This embodiment may include a second monitoring network similar to monitoring network (voltage monitor) 15 and a conditioning circuit of the same design as amplifier 16 and results in the creation of a second voltage monitoring signal V2. An example of this embodiment is shown in FIG. 2B, where a neutral grounding resistor monitor assembly 9A is shown, with like components to the aforementioned components of FIG. 2A having the same reference numbers. In this example, a second voltage sense circuit is shown as monitoring network 15A, this time, coupled to a terminal 60A along wire 41. The monitoring network 15A outputs the second voltage monitoring signal $V_2$ as shown.

Each embodiment of the aforementioned embodiments may entail processing and generating a multiplicity of measurement signals 52, 53 and 55 and control signals 50, 51, 54 and 56. Processing and generation of these signals is accomplished using the signal processing and control unit 21. Signal EN (50) provides an enable signal to the output amplifier 11 such that when this signal is logic high there is generated an output that tracks signal generator 10, and when the value is logic low the output performs as a high-impedance input. Processing and control unit 21 may include a processing algorithm to utilize two signals, signal $I_1$ (52) and signal $V_1$ (53) in a manner to generate a feedback signal depicted as signal FB (51). Signal 51 is a feedback signal from the output current amplifier 11 to ensure the output current signal represents what the signal processing and control unit 21 thinks is being sent out.

The protective feature of the neutral grounding resistor monitor assembly 9 has a primary output function. This primary function is an aggregation of the previously described functionality and results in a signal TRIP (54), which signal is coupled to operate a relaying device (22) to affect power system disconnect component 73. Various embodiments of neutral grounding resistor monitor assembly 9 may include an apparatus to detect the integrity of protective earth connection items 64 and 65 including the coupling wire connections between the terminal and protective earth. Protective earth detection element 23 is disposed between a first protective earth connection item 64 and a second protective earth connection item 65, and is arranged to generate signal LOSS OF PE (56) for processing device 21. Protective earth detection element 23 works by having a separate isolated power supply referencing PE via physical isolation from the other PE nets. This circuit will just works if the "isolated" PE provides a current path with the real PE.

Figure 3:
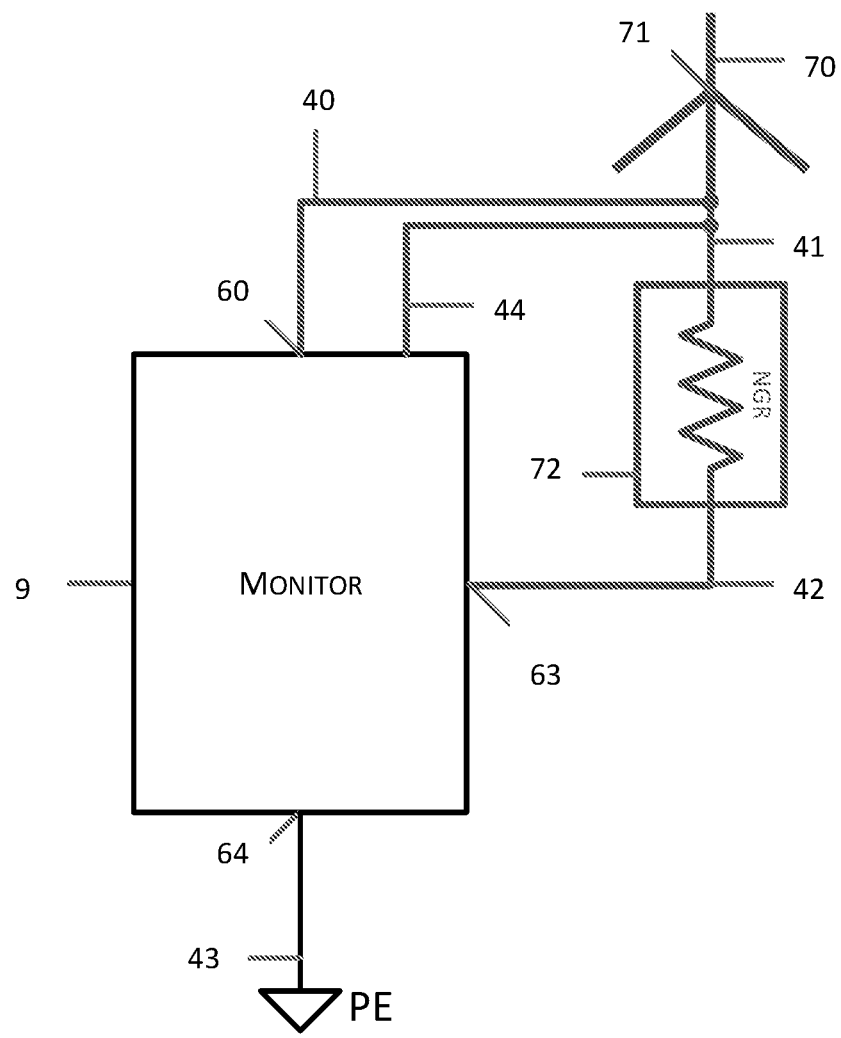
FIG. 3: Depicts a further protection arrangement according to various embodiments of this disclosure.

FIG. 3 presents a third embodiment of a neutral grounding resistor monitor assembly 9 which embodiment includes a second voltage monitoring circuit to generate signal V2 as described above, and detailed at FIG. 2B. The advantage of this embodiment is that losses due to parasitic line-to-earth loads can be more readily determined. Besides more accurately determining unintended loads, the value of neutral grounding resistor 72 can be more accurately determined. Further embodiments can increase the accuracy of the measurement by including a fourth wire to sense the low-side connection 62 of the neutral grounding resistor 72. This embodiment may require a voltage measurement across neutral grounding resistor 72.

Figure 4:
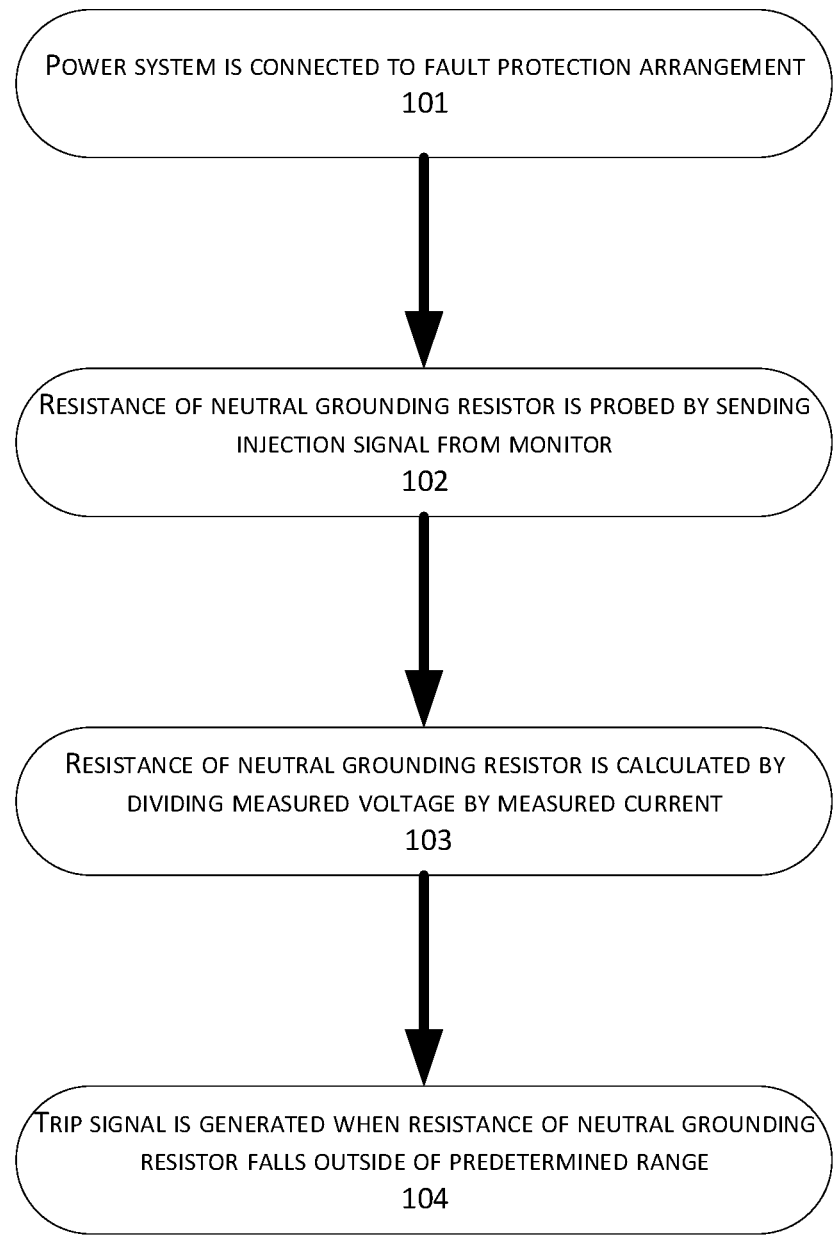
FIG. 4: Depicts an exemplary process flow.

FIG. 4 presents an exemplary process flow 100. At block 101, a power system is connected to a fault protection arrangement. The fault protection arrangement may include a neutral grounding resistor as well as a monitor assembly. At block 102, the resistance of the neutral grounding resistor is probed by sending an injection signal from the monitor assembly. At block 103, the resistance of the neutral grounding resistor is calculated by dividing a measured voltage by a measured current. At block 104, a trip signal is generated when the resistance of the neutral grounding resistor falls outside of a predetermined range. In various additional embodiments, a trip signal may be generated when various specific conditions are met. For example, a trip signal to disconnect the power system may be sent when just a ratio of $V_1/I_1$, just a ratio of $V_2/I_2$ or both the ratio of $V_1/I_1$ and the ratio of $V_2/I_2$ fall outside of a predetermined range. Also, there may be a trip signal sent upon the measurement of voltage and/or current depending on safety requirements.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A fault protection arrangement, comprising:
   a neutral grounding resistor comprising:
   a first end, connected to a neutralizing point, and a second end;
   a neutral grounding resistance monitor assembly, directly coupled to the second end of the neutral grounding resistor, and comprising:
   a signal source coupled to the neutralizing point;
   a first current sense circuit coupled between the signal source and the neutralizing-point;
   a first voltage sense circuit coupled between the signal source and the neutralizing-point;

a second current sense circuit, comprising a current sensor, coupled between the second end of the neutral grounding resistor and a protective earth connection;

a second protective earth connection, directly coupled to the signal source; and a protective earth detection element, disposed between the protective earth connection and the second protective earth connection.

2. The fault protection arrangement of claim 1, further comprising:

a two-terminal high-voltage current-limiting electronic device coupled between the signal source and the neutralizing-point.

3. The fault protection arrangement of claim 1, the signal source configured to generate a current-controlled output chosen from one of: DC, AC, and arbitrary waveform.

4. The fault protection arrangement of claim 1, the signal source configured to generate a voltage-controlled output chosen from one of: DC, AC, and arbitrary waveform.

5. The fault protection arrangement of claim 1, wherein the second current sense circuit comprises a non-contact sense circuit, the fault protection arrangement further comprising: a signal processing and control unit, coupled to the first current sense circuit, second current sense circuit, and first voltage sense circuit.

6. The fault protection arrangement of claim 5, further comprising a power system disconnect component, coupled to the signal processing and control unit.

7. The fault protection arrangement of claim 1, wherein the neutralizing point is a neutralizing point of a three phase transformer.

8. A fault protection arrangement, comprising:

a neutral grounding resistor comprising:
   a first end, connected to a neutralizing point, and a second end;
a neutral grounding resistance monitor assembly, directly coupled to the second end of the neutral grounding resistor, and comprising:
   a signal source coupled to the neutralizing-point;
   a first current sense circuit coupled between the signal source and the neutralizing-point;
   a first voltage sense circuit coupled between the signal source and the neutralizing-point;
   a second current sense circuit, comprising a current sensor coupled between the second end of the neutral grounding resistor and a protective earth connection; and
   a second voltage sense circuit, coupled to the first end of the neutral grounding resistor.

9. The fault protection arrangement of claim 8, wherein the second voltage sense circuit is coupled to measure a voltage without error induced from a wire coupling the first end of the neutral grounding resistor to the neutralizing point and a wire coupling an output form the signal source to the neutralizing point.

10. The fault protection arrangement of claim 8, further comprising:

a two-terminal high-voltage current-limiting electronic device coupled between the signal source and the neutralizing point.

11. The fault protection arrangement of claim 8, the signal source configured to generate a current-controlled output chosen from one of: DC, AC, and arbitrary waveform.

12. The fault protection arrangement of claim 8, the signal source configured to generate a voltage-controlled output chosen from one of: DC, AC, arbitrary waveform.

13. The fault protection arrangement of claim 8, further comprising:

a second protective earth connection, directly coupled to the signal source; and a protective earth detection element, disposed between the protective earth connection and the second protective earth connection.

14. The fault protection arrangement of claim 8, wherein the neutralizing point is a neutral of a three phase transformer.

15. The fault protection arrangement of claim 8, the fault protection arrangement further comprising: a signal processing and control unit, coupled to the first current sense circuit, second current sense circuit, and first voltage sense circuit.

16. The fault protection arrangement of claim 15, further comprising a power system disconnect component, coupled to the signal processing and control unit.

17. A fault protection method, comprising:

connecting a power system to a fault protection arrangement, the fault protection arrangement comprising:
   a neutral grounding resistor comprising:
      a first end, connected to a neutralizing point, and a second end; and
   a neutral grounding resistance monitor assembly, coupled to the first end and comprising a plurality of sense circuits;

sending a signal from a signal source of the neutral grounding resistance monitor assembly to a neutralizing point of the power system;

sensing a first current ($I_1$) between the signal source and the neutralizing point;

sensing a first voltage ($V_1$) between the signal source and the neutralizing point;

sensing a second current ($I_2$) between the second end and a protective earth terminal; and determining a ratio of $V_1/I_1$ and a ratio of $V_2/I_2$; and sending a trip signal to disconnect the power system, when just the ratio of $V_1/I_1$, just the ratio of $V_2/I_2$ or both the ratio of $V_1/I_1$ and the ratio of $V_2/I_2$ fall outside of a predetermined range.

18. The method of claim 17, further comprising:

sensing a second voltage, between the neutralizing point and first end of the neutral grounding resistor.

19. The method of claim 18, further comprising:

sending the signal through a two-terminal high-voltage current-limiting circuit, coupled between the signal source and the neutralizing point, wherein the signal source is current-controlled or voltage-controlled.

* * * * *